United States Patent [19]

Giebel et al.

[11] Patent Number: 5,326,994
[45] Date of Patent: Jul. 5, 1994

[54] PROTECTIVE CIRCUIT FOR PROTECTING CONTACTS OF MONOLITHIC INTEGRATED CIRCUITS BY PREVENTING PARASITIC LATCH UP WITH OTHER INTEGRATED CIRCUIT ELEMENTS

[75] Inventors: Burkhard Giebel, Denzlingen; Wilfried W. Gehrig, March, both of Fed. Rep. of Germany

[73] Assignee: Deutsche ITT Industries GmbH, Freiburg, Fed. Rep. of Germany

[21] Appl. No.: 955,765

[22] Filed: Oct. 2, 1992

[30] Foreign Application Priority Data

Oct. 22, 1991 [EP] European Pat. Off. ........ 91117957.0

[51] Int. Cl.$^5$ .................... H01L 29/74; H01L 29/06; H01L 29/78
[52] U.S. Cl. .................... 257/174; 257/357; 257/362; 361/91; 361/101; 361/111
[58] Field of Search ............ 257/173, 174, 355, 356, 257/357, 362; 361/91, 100, 101, 111

[56] References Cited

U.S. PATENT DOCUMENTS

| | | | |
|---|---|---|---|
| 4,633,283 | 12/1986 | Avery | 257/173 |
| 4,694,315 | 9/1987 | Svedberg | 357/23 |
| 4,870,530 | 9/1989 | Hurst et al. | 257/362 |
| 4,939,616 | 7/1990 | Rountree | 257/173 |
| 5,012,317 | 4/1991 | Rountre | 357/38 |

FOREIGN PATENT DOCUMENTS

55-113358 9/1980 Japan .

*Primary Examiner*—Ngan Ngo
*Attorney, Agent, or Firm*—Thomas L. Peterson

[57] ABSTRACT

A protective circuit for connecting contacts of monolithic integrated circuits, particularly CMOS input/output stages. The protective circuit has a four-layer device (ta, ts) with a defined switching threshold in the area of each connecting contact (A) and a low-resistivity current path (sa) from the connecting contact (A) to a supply terminal (VSS, VDD). The protective circuit also contains devices (zw2, z5) which prevent or provide a bypass for any undesired flow of current (i3, i4) between at least parts of the four-layer device and triggerable circuit regions (W2).

6 Claims, 3 Drawing Sheets

PROTECTIVE CIRCUIT FOR PROTECTING CONTACTS OF MONOLITHIC INTEGRATED CIRCUITS BY PREVENTING PARASITIC LATCH UP WITH OTHER INTEGRATED CIRCUIT ELEMENTS

BACKGROUND OF THE INVENTION

1. Field of the Invention

The present invention relates to a protective circuit for protecting connecting contacts of monolithic integrated circuits from electrostatic discharges, particularly of input/output stages implemented in CMOS technology.

The invention further relates to a method of protecting monolithic integrated circuits from ESD pulses wherein the electrostatic charges in the areas of the connecting contacts are neutralized by means of resistive and sink devices.

2. Description of the Prior Art

The invention comprises resistive and sink devices for protecting connecting contacts of monolithic integrated circuits from electrostatic discharges. "Electrostatic discharges" as used herein means impulse currents caused by electrostatic discharge pulses (hereinafter ESD pulses). However, the protection also extends to steady-state currents which are supplied to the respective connecting contacts which may cause undesirable, thyristor-like conduction known as "latch-up".

The ESD pulse may, in the worst case, lead to breakdown between at least two semiconductor regions, forming a shorting channel which causes the circuit to cease functioning. The thin gate oxide of MOS transistors is particularly vulnerable. Another, frequent consequence of the ESD pulse is that it induces latch-up in certain semiconductor structures, whereby a short circuit is developed in the crystal shorting the supply lines that may result in a malfunction due to local overheating. This latch-up condition, as stated above, may also be initiated by a steady-state overload current supplied to the connecting contact, particularly in CMOS input/output stages. The wells required in CMOS technology, particularly in the complementary output-transistor pair, possibly also together with other subcircuits, represent thyristor-like circuit structures interconnected via the substrate which can be put into a latch-up condition and which will remain in this condition until the input current falls below the holding current.

To protect the connecting contacts from being destroyed by ESD pulses, resistive and sink devices are commonly provided which limit the overload voltages to low values, thus neutralizing the ESD pulses within the contact area as far as possible. Use is made of sink diodes, for example, which are normally operated in the reverse direction and exhibit a drainage effect both in their forward direction and in their breakdown direction. However, the breakdown threshold varies widely depending on the process technology used, and is hardly suited to reliably protecting all functional units associated with the respective connecting contacts. In MOS circuits, the n-channel output transistors are particularly vulnerable to breakdown.

Accordingly, it is the object of the invention as claimed to provide a circuit and a method for reliably protecting all connecting contacts of monolithic integrated circuits from ESD pulses which can be adapted to different technological parameters predominantly by proper circuit layout, with the integrated circuit being in a power-off or power-on condition.

BRIEF SUMMARY OF THE INVENTION

The fundamental idea of the invention is to form in the area of each connecting contact at least one four-layer device (thyristor) which has a defined turn-on threshold and represents a low-resistivity current path which leads from the connecting contact to a supply terminal and bypasses particularly the vulnerable n-channel transistor. The protective circuit includes structures which minimize any undesirable influence of this four-layer device on other triggerable four-layer devices which may provide a low-resistivity current path between the positive and negative supply terminals.

The resistivity of the sink current path and the level of the turn-on threshold in a given integrated circuit are commonly checked quantitatively by an ESD test and latch-up tests. In the ESD test, a 100-picofarad capacitor charged to several kilovolts, for example, is discharged through a 1500-ohm resistor to the connecting contact for a short time. This permits the effects of static discharges, which can generate peak currents of several amperes, to be simulated in a defined manner. In the latch-up test, a steady-state or slowly increasing current is supplied through a current source to the respective connecting contact, and it is determined whether a parasitic thyristor in the circuit is triggered. If, in this test, a current value of 50 milliamperes is reached without a parasitic thyristor being triggered, the circuit is considered sufficiently latch-proof for many applications.

More specifically the invention is a protective circuit for protecting the connecting contacts from electrostatic discharges by means of resistive and sink structures and corresponding devices. The protective circuit is for protection from electrostatic discharges in a monolithic integrated circuit defined in a substrate (Sb) including other circuit elements, connecting contacts (A), and first and second supply terminals (VSS, VDD). The protective circuit comprises at least one four-layer device (thyristor) (ta, ts) with a defined turn-on threshold and a low-resistivity sink path (sa) from the connecting contact (A) to the supply terminal (VSS, VDD) in the area of each connecting contact (A). A circuit element (z5) reduces the percentage of current (i4) flowing between at least parts of the four-layer device (ta, ts) and the other circuit elements (t2') with which parts (ta) of the four-layer device the other circuit elements (t2') form other four-layer devices (ta, t2').

The four-layer device (ta, ts) contains at least one three-layer device (ts) comprising the substrate (Sb), a semiconductor region (z4) formed in the substrate as a well (W1), and a semiconductor region (z3) disposed in the well. The conductivity types of the successive layers (Sb, z4, z3) of the three-layer device are opposite to each other, and the substrate (Sb) is of a first conductivity type.

The four-layer device (ta, ts) is formed in a first and second semiconductor zone (H1, H2) by means of regions formed into the surface of the substrate. The four-layer device (ta, ts) contains in the first semiconductor zone (H1) a first and second region (z1, z2) of a second conductivity type in a lateral configuration separated by a substrate wall (st). The protective circuit further comprises a contact area (a1) and a first and a second interconnection (f1, f2) connected to the contact area and has connected thereto drain terminals (D1, D2) of complementary CMOS output transistors (t1, t2). The first region (z1) provides a conductive connection at least between the connecting contact (A) and a contact area (a1) for the first and second interconnection (f1, f2). The second region (z2) is connected to the first supply terminal (VSS). The second semiconductor zone (H2) comprises a third region (z3) of the first conductivity type, a third interconnection (f3) and a fourth region (z4) of the second conductivity type, which forms a well (W1). The third region (z3) is coupled to the contact area (a1) by the third interconnection (f3) and is disposed in the fourth region (z4) of the second conductivity type. A lateral distance (s1) is defined between the first and second regions (z1, z2). A distance (s2) is defined between the first and second semiconductor zones (H1, H2) and lengths of the respective adjacent edge regions are defined so that after attainment of the turn-on threshold, the low-resistivity sink path (sa), which is controlled by the thyristor-like interaction of the first and second semiconductor zones, has at least one predetermined conductivity value. Otherwise, the turn-on threshold is not reached under normal operating conditions.

The protective circuit further comprises triggerable wells (W2). The distance (s2) between the first and second semiconductor zones (Hi, H2) is less than the distance (s3) between the first semiconductor zone (H1) and triggerable wells (W2) of the second conductivity type. The intermediate region between the first semiconductor zone (H1) and wells (W2) contains a plurality of collecting devices (zw2, z5) for unwanted currents (i3, i4). The collecting devices are connected to the first or second supply terminal (VSS, VDD).

The second region (z2) surrounds the first region (z1), at least in part, in the form of a ring. The first region (z1) extends, at least in part, beyond the region covered by the connecting contact (A).

The protective circuit, where those subcircuits for which the connecting contact (a) serves as a signal input, are connected by a fourth interconnection (f4) to a contact (a3) of the third region (z3) which is remote from the connecting contact (A).

The invention is also a method of protecting monolithic integrated circuits from electrostatic discharge (ESD) pulses wherein the electrostatic charges in the regions of the connecting contacts are neutralized by circuit of resistive and sink devices. The method comprising the steps of controlling a low-resistivity sink path (sa) for the ESD pulses by circuit of a four-layer device (thyristor) (ta, ts) provided from the connecting contact (A) to a supply terminal (VSS, VDD). The four-layer device has a defined turn-on threshold. Unwanted currents (i3, i4) between the four-layer device (ta, ts) and triggerable wells (W2) are prevented by a plurality of collecting devices (zw2, z5), which cause the currents to be shorted to the first supply terminal (VSS) and/or the second supply terminal (VDD).

The method further comprising the steps of connecting in a first semiconductor zone (H1) the connecting contact (A) by means of a first region (z1) to form a first resistor (rn) to a low-resistance first and second interconnection (f1, f2). In the first semiconductor zone (H1) the first region (z1) and a lateral second region (z2) of the same conductivity type forms a sink transistor (ta) whose collector (K1), base (B1), and emitter (E1) are respectively the edge portion of the first region (z1), the substrate (Sb), and the second region (z2). The second region (z2) is connected to the first supply terminal (VSS) and the first and second regions are separated by a substrate wall (st). In a second semiconductor zone (H2) adjacent to the first semiconductor zone (H1) a substrate transistor (ts) is formed whose conductivity type is opposite to that of the sink transistor (ta). Substrate transistor (ts) is comprised of: an emitter (E2) by means of a third region (z3) which is connected to the low-resistance second interconnection (f2) and is disposed in a first well (W1) constituted by a fourth region (z4) with the first well connected to the second supply terminal (VDD); a base (B2) by circuit of the first well (W1) (fourth region); and a collector (K2) by circuit of the substrate (Sb).

The method further comprising the step of setting the turn-on threshold for the latch-up of the sink transistor (ta) and substrate transistor (ts) as well as the conductivity of the sink current path (sa) by means of the distance (s1) between the first and second regions (z1, z2) and by means of the distance (s2) between the first and second semiconductor zones (H1, H2), their respective superficial area, and the lengths of the respective adjacent edge regions.

The method further comprising the step of preventing latch-up of the sink transistor (ta) with triggerable wells (W2) by selecting the magnitude of the distance (s3) to the wells (W2) and by causing the unwanted currents (i3, i4) to flow off by circuit of collecting devices (zw2, z5) in the intermediate zone defined by the distance (s3).

The unwanted current (i4) is caused to flow off via a plurality of substrate contact regions which are: formed by a fifth region (z5) of the same conductivity type as the substrate (Sb); connected to the first supply terminal (VSS); and located as contact areas between the sink transistor (ta) and the further triggerable wells (W2).

The method further comprising the step of forming a second resistor (rp) by circuit of the third region (z3). The second resistor (rp) has a fourth interconnection (f4) for associated input stages (I) connected to its contact (a3) remote from the connecting contact (A).

The invention and further advantages will now be explained in greater detail with reference to the accompanying drawings.

The invention and its various embodiments can now be understood by turning to the following detailed description.

DETAILED DESCRIPTION OF THE PREFERRED EMBODIMENTS

Figure 1:
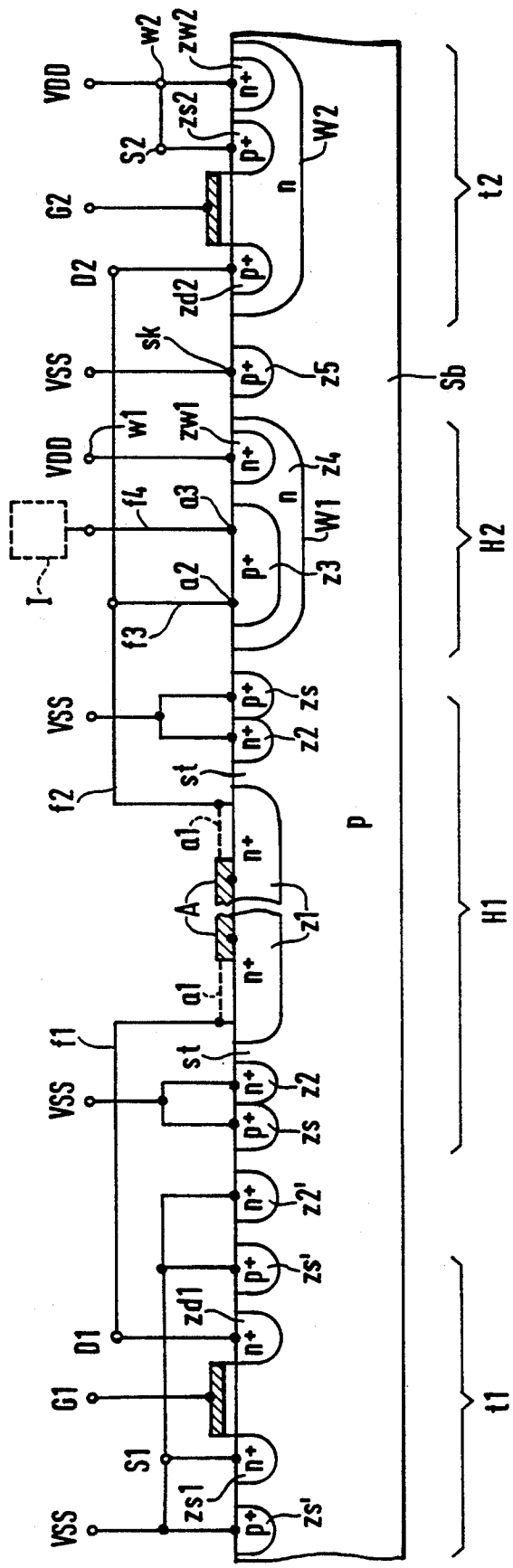
FIG. 1 shows a preferred embodiment of the invention as a schematic cross section of a semiconductor chip with a CMOS input/output stage in the region of a connecting contact.
Figure 3:
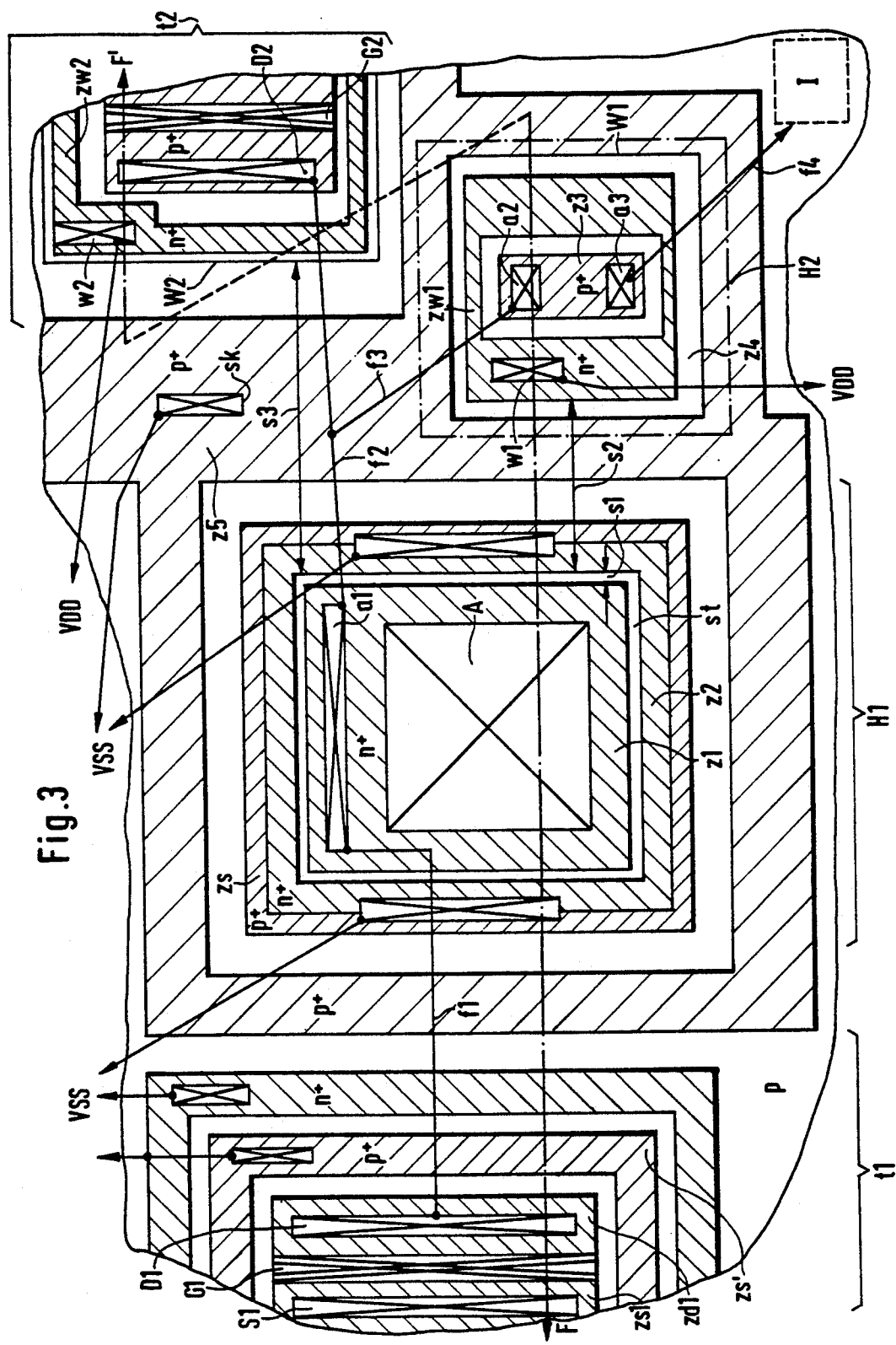
FIG. 3 shows the layout of FIG. 1 in a schematic plan view.

The cross-sectional view of the semiconductor chip shown in FIG. 1 corresponds approximately to the section taken along line F-F' of FIG. 3. The associated wiring is shown in FIG. 1 only schematically. Various regions of different conductivity types, which are shown as "n" or "p", have been formed into the p-type substrate Sb. The formation of the individual regions is, as far as possible, adapted to the respective process technology used, so that the protective circuit can be fabricated without additional processing steps.

A first semiconductor zone H1 contains the connecting contact A, a bonding pad, for an underlying $n^+$-type first region z1. The first region z1 takes up a greater area than, and extends beyond, the bonding pad A. Parallel to one edge, a contact tract, namely the contact a1, is provided on the first region z1; it is connected by a first and second low-resistance interconnection f1, f2 to the drain contacts D1, D2 of an n-channel output transistor t1 and a p-channel output transistor t2, respectively. The first region z1 forms a low-value resistor rn (first resistor), schematically depicted in FIGS. 2 and 4, which has one end connected directly to the bonding pad A.

Figure 2:
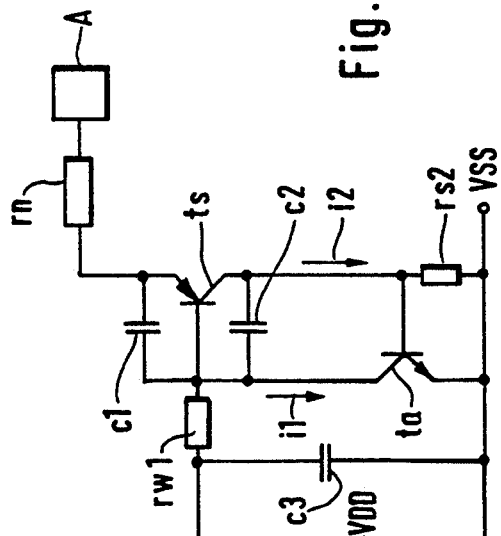
FIG. 2 shows the equivalent circuit of a thyristor according to the invention connected to the connecting contact.
Figure 4:
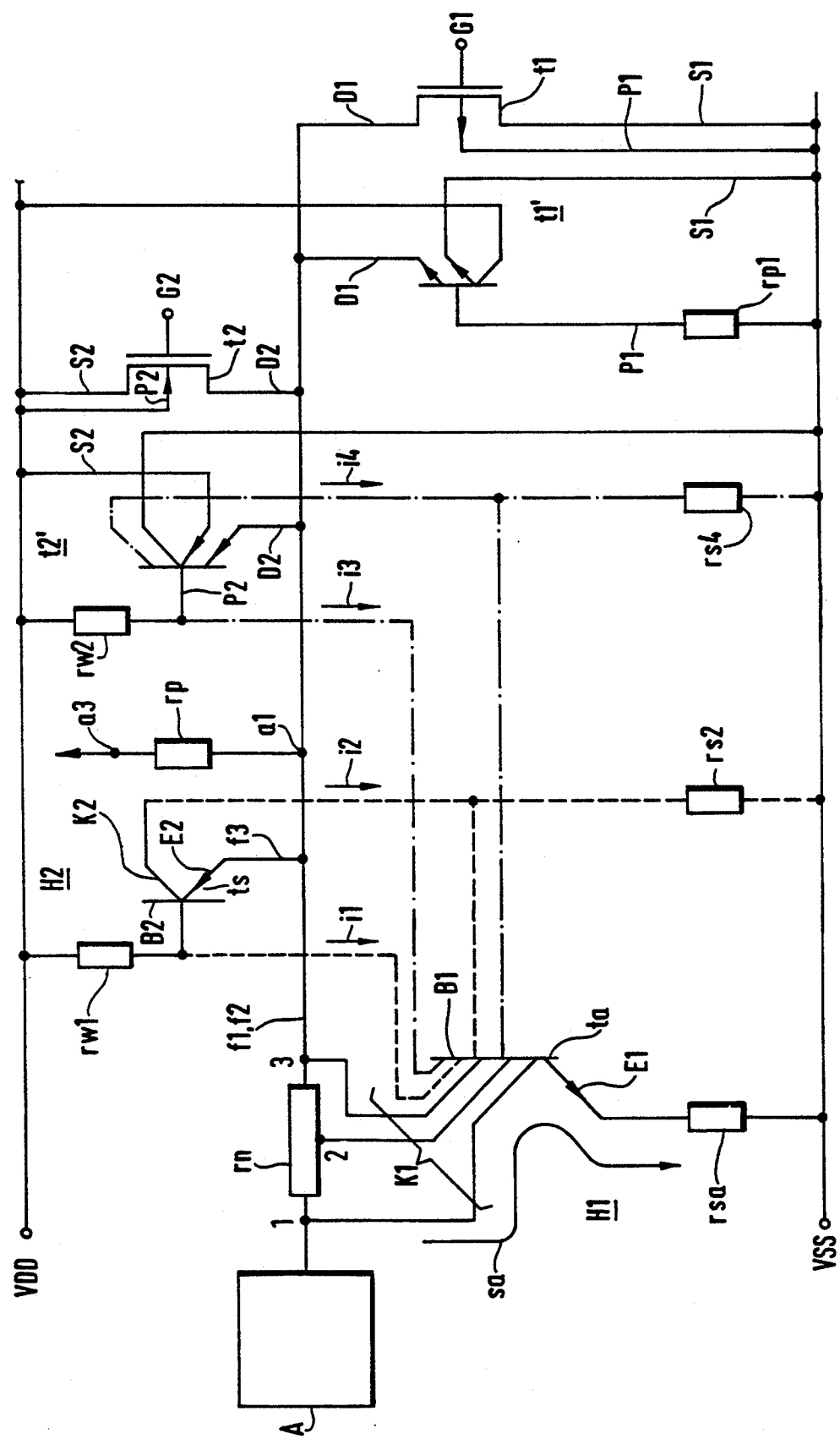
FIG. 4 shows a detailed equivalent circuit for FIGS. 1 and 3.

The first region z1 is surrounded by an $n^+$-type second region z2, and the two regions are separated by a narrow substrate wall, st. Advantageously, at least part of the second region z2 forms a ring around the first region z1, as shown in the plan view layout of FIG. 3. This does not exclude other embodiments for the geometric layout of regions z1, st and z2, such as being located on only one side, interdigitated, meandering, or island-shaped; what is important is that the substrate wall, st, has a length and width defined by the circuit layout. The second region z2 is connected via contacts to the substrate supply voltage, which is applied at a first supply terminal VSS. Contact to the substrate Sb is made through a $p^+$-type region, zs, which may also be contiguous to the second region z2, as shown. The regions described, z1, z2, zs, define the first semiconductor zone H1. By means of the first region z1 and the laterally disposed second region z2, a sink transistor ta of the npn conductivity type is formed, as is schematically depicted in FIGS. 2 and 4. Its distributed collector K1 schematically shown in FIG. 4 is formed by the edge portion of the first region z1, its base B1 by the substrate wall, st, and its emitter E1 by the second region z2. Via the width and length of the substrate wall, st, the current gain and current yield of the sink transistor ta can be set.

A second semiconductor zone H2, which is adjacent to the first semiconductor zone H1, contains a three-layer device, namely a substrate pnp transistor ts, schematically shown in FIGS. 2 and 4. The substrate transistor is formed by the following regions. The emitter E2 is formed by a $p^+$-type third region z3, which is connected to the low-resistance second interconnection f2 and is disposed in a first well W1 constituted by an n-type fourth region z4. The first well is connected via an $n^+$ contact region zw1 a well contact w1 to a second supply terminal VDD, which is tied to a positive supply voltage.

The base B2 of the substrate transistor ts is formed by the first well W1, and the collector K2 by the substrate Sb. The size of the substrate transistor and, consequently, its current yield are determined by the size of the common area of the third and fourth regions z3, z4. The current gain depends on the vertical structure and the associated impurity profile, which can be influenced via the implantation and diffusion and is thus determined by the process technology used. The third region z3 is advantageously implemented as a $p^+$ resistor rp, the second resistor shown schematically in FIG. 4, having connecting contacts a2, a3, with the contact a2 connected to the low-resistance second interconnection f2 by a third interconnection f3. In pure input circuits and in input/output circuits, the contact a3 commonly serves to connect together the associated internal input stages I on the signal-processing chip. This has the advantage that the input circuits I are decoupled from the bonding pad A by a T section with the two resistors rp, rn, as schematically shown in FIG. 4. The $p^+$ resistor rp may then have a substantially greater value than the $n^+$ resistor rn.

In FIG. 1, the second semiconductor zone H2 is followed by an n-channel output transistor t2, whose $p^+$ source and drain regions zs2, zd2 are disposed in a second n well W2. The source contact S2, the well contact W2, and the $n^+$ contact region zw2 are commoned to the second supply terminal VDD. On the other side of the first semiconduction zone H1 is the n-channel output transistor t1, whose $n^+$ source and drain regions zs1, zd1 are disposed directly within the substrate Sb, with the terminal S1 and further $p^+$ substrate contact regions zs, zs', z5 connected to the first supply terminal VSS.

The spatial separation between the n- and p-channel output transistors t1, t2 as shown in FIG. 1 is a common means of preventing latch-up. The plurality of substrate contact regions zs, zs', z5 serve the same purpose by draining off the substrate currents to the first supply terminal VSS.

In the preferred embodiment shown in FIG. 1, the above object is attained by providing an effective sink current path between the bonding pad A and the first supply terminal VSS which is controlled by the latch-up of the first and second semiconductor zones H1, H2. The latch-up occurs above a turn-on threshold which is not reached under normal operating conditions. On the other hand, any parasitic latch-up of other triggerable structures, such as the n well W2, with the first semiconductor zone H1 is to be prevented, particularly if this provides a low-resistivity short-circuit path between the positive and negative supply terminals VDD, VSS. The desired sink current path sa schematically shown in FIG. 4 is to be provided only between the bonding pad A and the substrate supply terminal VSS (first supply terminal). In another implementation, the sink path may of course also be connected to the second supply terminal VDD.

According to the invention, parasitic latch-up is prevented as follows. The parasitically triggerable n wells—these include mainly the well W2 of the p-channel output transistor t2—must be located at a safe distance from the first semiconductor zone H1 which is equal to about 5 to 50 times the respective n-well penetration depth. The decisive factor, however, is the value of the substrate bulk resistor, which is formed between the first semiconductor zone H1 and the triggerable n wells. To a first degree of approximation, the bulk resistance depends on the ratio of the adjacent n-well edge length to the distance from the substrate wall, st, on the vertical substrate thickness, and on the substrate doping concentration. This applies as long as the n-well edge length is small compared with the effective length of the substrate wall, st.

A free space is thus created which can be used for devices that prevent latch up due to the flow of the unwanted currents i3, i4 as shown schematically in FIG. 4, namely for collecting devices which drain these currents to the first or second supply terminals VSS, VDD. Such collecting devices are, for example, a plurality of substrate contact regions which are formed by the $p^+$- type fifth regions z5 and are connected to the first supply terminal VSS. The second collecting devices are a plurality of well contact regions which are formed by the n+ regions zw2 and are connected to the second supply terminal VDD. Another possibility (not shown in FIG. 1) would be to use auxiliary collectors formed by n+ regions, which would drain away the substrate currents to the second supply terminal VDD. A further possibility is to reduce the current gain of the sink transistor ta in the region of these substrate currents. The advantage of the individual methods is that their effectiveness can be determined quantitatively by the ESD and latch-up tests, and that selective correction in the layout is possible without the individual mechanisms acting upon one another. Furthermore, ESD strength and latch-up strength can be adjusted independently of each other within certain limits.

FIG. 2 shows schematically the thyristor connected to the bonding pad A. It consists of the sink transistor ta and the substrate transistor ts. Latch-up is caused by the first and second currents i1, i2. The first current flows from the base of the substrate transistor ts to the collector of the sink transistor ta, and the second current flows from the collector of the substrate transistor ts to the base of the sink transistor ta. The flow of the currents i1 and i2 into the second supply terminal VDD and the first supply terminal VSS is represented by the well resistors rw1 and the substrate resistor rs2, respectively. The base of the substrate transistor is the first well W1 and is connected to the second supply terminal VDD. The bonding pad A is connected through the n+ resistor rn to the emitter of the substrate transistor ts.

The thyristor shown in FIG. 2 can be triggered in two different ways. Either statically by means of a steady-state current at the bonding pad A, with the base of the substrate transistor ts being clamped by the second supply terminal VDD, or dynamically by an impulse current at the bonding pad A, with the base of the substrate transistor ts being clamped dynamically by the high VDD/VSS total capacitance (e.g., several nanofarads). Dynamic triggering is essential for the protection from ESD pulses. As a result of the base current i1, the substrate transistor ts delivers a collector current i2 to the base of the sink transistor ta, which further increases the base current of the substrate transistor ts via its collector current. This positive feedback mechanism initiates the triggering process of the thyristor, but only as long as a current of sufficient magnitude is available at the bonding pad A. The proper overcurrent sink path, designated sa in FIG. 4, is not shown in FIG. 2.

The second triggering process of the thyristor shown in FIG. 2 can be initiated by a high rate of voltage rise du/dt at the emitter of the substrate transistor ts. This is caused by an ESD pulse, for example, which may result in rates of voltage rise on the order of 100 volts/-nanosecond. The discharge pulse reaches its voltage maximum on the order of about 1 kilovolt to 10 kilovolts after approximately 10 nanoseconds. It is obvious that the associate currents will cause local destruction in the semiconductor chip unless they are drained away via an efficient means at the connecting contact. At such high rates of rise, the substrate transistor ts will pull the base of the nonconducting sink transistor ta along via the series combination of its base-emitter and base-collector capacitances c1, c2, driving this transistor into a weakly conducting state. The transistor is caused to conduct more heavily by the above-described positive feedback mechanism until the thyristor is fully on. This turn-on mechanism occurs both with the supply voltage applied and in the power-off condition—also in the case of an isolated device outside a circuit—, thus providing ideal protection from electrostatic discharges through the connecting contacts.

FIG. 3 shows a part of the semiconductor chip in the area of the bonding pad A in a schematic plan view. The semiconductor zones shown in the cross section of FIG. 1 are located approximately along the line F-F'. On the left-hand side is the n-channel output transistor t1, whose drain contact D1 is connected to the contact a1 of the first region z1 by the first interconnection f1. The first region z1, provided with the bonding pad A and the contact a1, extends beyond the bonding pad A on all sides.

Also connected to the contact a1 is a second interconnection f2, which leads to the drain contact D2 of the p-channel output transistor t2. The latter is disposed in the second n well W2, which is connected to the second supply terminal VDD via an n+ contact region zw2 and a well contact w2.

The low-value n+ resistor rn (see FIGS. 2 and 4) is formed through the distance of the contact a1 from the bonding pad A and by means of the first region z1, which distance electrically separates the bonding pad A from the low-resistance interconnections f1, f2. The first region z1 is surrounded by the annular second region z2 of the same n+ conductivity type, with the two regions being separated from each other by the narrow substrate wall, st. The second region z2 is surrounded by the annular additional p+ region zs, which serves to make contact to the p-type substrate. The annular regions and the adjoining second region z2 are contacted together and connected to the first supply terminal VSS. For convenience of illustration, contact is made to the individual regions in FIG. 3 only once. The low-resistance interconnections, which may consist of several wiring levels, are shown as lines with contact points.

The central location of the bonding pad A on the first region z1 and the encirclement of the latter by the second region z2 are not indispensable, of course, but they are very advantageous, because in this manner, in addition to the sink transistor ta, a large-area sink diode, which provides additional protection, is formed directly below the bonding pad A by means of the first region z1. The n+ regions z2' of FIG. 1 and FIG. 3, which are connected to the first supply terminal VSS serve a similar purpose.

In the second semiconductor zone H2, the substrate contains those regions which form the substrate transistor ts, which is designed as a vertical pnp transistor. The base corresponds to the first well W1, which is formed by the n-type fourth region z4. Contact to the first well W1 is made through the low-resistivity n+ contact region zw1, which is connected to the second supply terminal VDD via the first well contact w1. The well contains the p+-type third region z3, which is separated from the n-type material by a pn junction and is connected via the second interconnection f2. The third region z3 is shown in FIG. 3 as a rectangular resistive element, whose second terminal is formed by the contact a3. The input circuits I, shown only schematically in FIG. 3, are connected to the bonding pad A via this p+ resistor rp (see FIGS. 2 and 4) and a fourth interconnection f4. In a pure output configuration, the fourth interconnection f4 and the associated connecting contact a3 are not necessary.

In FIG. 3, the second well W2, which is triggerable with the first semiconductor zone H1, is separated from the substrate wall st by the distance s3. In the intermediate area, a wide region, the p+-type fifth region z5, is provided, which is connected via a plurality (not shown) of substrate contacts sk to the first supply terminal VSS. Between the first and second semiconductor zone H1, H2, there is also a p+ substrate contact region formed by the fifth region z5, which, however, is considerably narrower than that in the area of the second well W2. The triggering behavior of the desired thyristor can be influenced in a defined manner by proper circuit layout through the distance s2 between the first and second semiconductor zones, the intermediate substrate contact region, and the width s1 of the substrate wall st.

FIG. 4 shows a detailed equivalent circuit for the representations of FIGS. 1 and 3. The first region z1, which is connected to the bonding pad A, forms the n+ resistor rn, to which the first and second interconnections f1, f2 are connected. In addition, the first region z1, in conjunction with the second region z2 and the substrate wall st, forms a lateral npn transistor, namely the sink transistor ta. The latter has, in the first region z1 along the substrate wall st, a distributed collector K1, which is shown in FIG. 4 as a multiple collector. Three of these collectors are connected to the three taps 1, 2, 3 of the resistor rn.

The tap 1 is that edge region of z1 in FIG. 3 which lies outside the range of influence of the contact a1. The tap 3 is that edge region of z1 which lies approximately alongside the contact a1. The tap 2 is formed by the intermediate regions lying approximately between these two edge regions. From FIG. 3 it is apparent that about ⅔ of the edge portion of the first region z1 belongs to the tap 1 as the main collector. It provides the low-resistivity sink path sa for the ESD pulses or overload currents which reach the bonding pad A. The resistivity of this current path sa is determined essentially by the value of the emitter resistor rsa, which is shown in the emitter current path of the sink transistor ta. The emitter E1 is formed by the second regions z2.

Part of the current injected by the emitter E1 flows not into the first region z1, but into other N regions. This is symbolized in the distributed collector K1 by the collectors indicated by dashed lines. Part of the emitter current flows as the first current i1 into the first semiconductor zone H1. An unwanted part of the current flows as the third current i3 into the well region of the p-channel output transistor t2.

The second semiconductor zone H2 forms a vertical pnp transistor, namely the substrate transistor ts. The emitter E2 of the latter is connected through the n+ resistor rn to the bonding pad A. The base B2 is connected to the second supply terminal VDD through the n+ resistor rn to the bond pad A. The base B2 is connected to the second supply terminal VDD through the well resistor rw1 formed by the first well W1. The collector K2 is formed by the substrate Sb and delivers the second current i1, which partly flows to the base B1 of the sink transistor ta. Since the first current i1 flows to the base B2 of the substrate transistor ts, these two transistors can interact in the manner of a thyristor. However, this is possible only as long as the potential at the bonding pad A exceeds the potential at the base B2 by a base-emitter threshold voltage. The two transistors cannot cause a short circuit between the two supply terminals VDD, VSS. The equivalent resistance rw1 corresponds to the well contact region zw1 within z4. The equivalent resistance rs2 corresponds to the substrate contact regions zs between the first and second semiconductor zones H1, H2. These provide bypasses for the first and second currents i1, i2, to VDD and VSS respectively, in a defined manner.

The distributed collector K1 feeds the undesired current i3 into the base of a parasitic substrate pnp transistor t2', which results automatically from the p-channel output transistor t2. A particular danger is that one of the double emitters of this parasitic transistor t2' is connected directly to the second supply terminal VDD. Upon activation of this transistor t2', this emitter connection would supply a very large current i4 flowing to the base B1, which current, together with the third current i3, would form the positive feedback circuit of a parasitic thyristor ta, t2'. The latter would latch independently of the potential at the bonding pad A as long as the thyristor current is supplied from the low-impedance second supply terminal VDD. The unwanted currents i3, i4, however, are kept to a minimum by suitable collecting devices z5 and zw2, in the simplest case by large-area well or substrate contacts within the area of between the first semiconductor zone H1 and the triggerable well W2, see FIG. 3. The low resistivity sinking of the undesired currents i3 and i4 is symbolized in FIG. 4 by the well and substrate resistors rw2 and rs4, respectively.

As is well known, the n-channel output transistor t1 is shunted by a parasitic element in the form of a substrate npn transistor t1' with double emitter. One of the emitters, which belongs to the drain terminal D1, is connected to the first interconnection f1, and the other emitter, which belongs to the source terminal S1, is tied to the first supply terminal VSS. The parasitic transistor t1' cannot interact in the manner of a thyristor with the sink transistor ta, but can with the parasitic substrate pnp transistor t2'. This undesired effect is prevented by conventional measures as described above, e.g. by the spatial separation on opposite sides of the bonding pad A as shown in FIG. 3.

The bulk connection P1 of the n-channel output transistor t1 forms the base connection of the parasitic substrate npn transistor t1' with the associated bulk equivalent resistance rw1 to the first supply terminal VSS. The bulk connection P2 of the p-channel output transistor t2 forms the base connection of the parasitic substrate pnp transistor t2' with the associated bulk equivalent resistance rw2 to the second supply terminal VDD.

The embodiments relate to CMOS monolithic integrated circuits with p-type substrate. The invention can of course also be used for protective circuits of CMOS circuits with n-type substrate. The invention is further applicable to all technologies in which four-layer devices can be represented. The protective circuit according to the invention can also be used for bipolar circuits, since the protective mechanisms are based on purely bipolar circuit functions, which can be implemented with or without MOS transistors using conventional monolithic integrated circuit fabrication techniques, particularly by proper circuit layout.

We claim:

1. In a monolithic integrated circuit defined in a substrate (Sb) including a plurality of active circuit elements (t2'), a connecting contact (A), and a first and second supply terminal (VSS, VDD), a protective circuit for protecting the connecting contacts from electrostatic discharges by means of resistive and sink devices for electrostatic discharges comprising:

at least one four-layer device (thyristor) (ta, ts) with defined switching threshold and a low-resistivity sink path (sa) from the connecting contact (A) to at least one of the first and second supply terminals (VSS, VDD) proximate to each connecting contact (A); and means (zw2, z5) for preventing substantial flow of parasitic current (i3, i4) between at least portions of the four-layer device (ta, ts) and at least one of said plurality of active circuit elements (t2'), prevention of said flow of said parasitic current (i3, i4) by said means (zw2, z5) thereby preventing the operation of a four-layer device (ta, t2') in said monolithic integrated circuit.

2. The protective circuit of claim 1 wherein the four-layer device (ta, ts) contains at least one three-layer devices (ts) comprising the substrate (Sb), a semiconductor region (z4) formed in the substrate as a well (W1), and a semiconductor region (z3) disposed in the well, with the conductivity types of the successive layers (Sb, z4, z3) of the three-layer device being opposite to each other, and the substrate (Sb) being of a first conductivity type.

3. In a monolithic integrated circuit defined in a substrate (Sb) including a plurality of circuit elements, a connecting contact (A), and a first and second supply terminal (VSS, VDD), a protective circuit for protecting the connecting contacts from electrostatic discharges by means of resistive and sink devices for electrostatic discharges comprising:

at least one four-layer device (thyristor) (ta, ts) with defined switching threshold and a low-resistivity sink path (sa) from the connecting contact (A) to at least one of the first and second supply terminals (VSS, VDD) proximate to each connecting contact (A); and means (zw2, z5) for preventing substantial flow of current (i3, i4) between at least portions of the four-layer device (ta, ts) and at least one of said plurality of circuit elements (t2'), said plurality circuit elements (t2') forming four-layer devices (ta, t2') with said portions of the four-layer device (ta);

wherein the four-layer device (ta, ts) contains at least one three-layer devices (ts) comprising the substrate (Sb), a semiconductor region (z4) formed in the substrate as a well (W1), and a semiconductor region (z3) disposed in the well, with the conductivity types of the successive layers (Sb, z4, z3) of the three-layer device being opposite to each other, and the substrate (Sb) being of a first conductivity type; and wherein the four-layer device (ta, ts) is formed in a first and second semiconductor zone (H1, H2) by means of regions formed into a surface of the substrate, and contains in the first semiconductor zone (H1), in a lateral configuration, a first and second region (z1, z2) of a second conductivity type separated by a substrate wall (st);

wherein the protective circuit further comprises a contact area (a1) and a first and a second interconnection (f1, f2) connected to said contact area and having connected thereto drain terminals (D1, D2) of complementary CMOS output transistors (t1, t2) and wherein the first region (z1) provides a conductive connection at least between the connecting contact (A) and a contact area (a1) for the first and second interconnection (f1, f2);

wherein the second region (z2) is connected to the first supply terminal (VSS);

wherein the second semiconductor zone (H2) comprises a third region (z3) of the first conductivity type, a third interconnection (f3), and a fourth region (z4) of the second conductivity type, which forms a well (W1), the third region (z3) being coupled to the contact area (a1) by the third interconnection (f3) and disposed in the fourth region (z4) of the second conductivity type; and a lateral distance (s1) being defined between the first and second regions (z1, z2), a distance (s2) being defined between the first and second semiconductor zones (H1, H2), and lengths of the respective adjacent edge regions being defined so that after attainment of the turn-on threshold, the low-resistivity sink path (sa), which is controlled by the thyristor-like interaction of the first and second semiconductor zones, has at least one predetermined conductivity value, otherwise the turn-on threshold not being reached under normal operating conditions.

4. The protective circuit of claim 3 further comprising triggerable wells (W2) wherein the distance (s2) between the first and second semiconductor zones (H1, H2) is less than the distance (s3) between the first semiconductor zone (H1) and triggerable wells (W2) of the second conductivity type, and wherein the intermediate region between the first semiconductor zone (H1) and further triggerable wells (VV2) contains a plurality of collecting devices (zw2, z5) for unwanted currents (i3, i4), said collecting devices being connected to the first or second supply terminal (VSS, VDD).

5. The protective circuit of claim 4 wherein the second region (z2) surrounds the first region (z1), at least in part, in the form of a ring, and that the first region (z1) extends, at least in part, beyond a region covered by the connecting contact (A).

6. The protective circuit of claim 5 wherein said monolithic integrated circuit comprises a plurality of subcircuits, and wherein at least one of said plurality of subcircuits has an input signal coupled thereto from said connecting contact (a), said connecting contact (a) being connected by a fourth interconnection (f4) to a contact (a3) of the third region (z3) which is remote from the connecting contact (A).

* * * * *